(12) United States Patent
Hsieh et al.

(10) Patent No.: US 7,906,792 B2
(45) Date of Patent: Mar. 15, 2011

(54) SEMICONDUCTOR LIGHT-EMITTING DEVICE AND METHOD

(75) Inventors: Min-Hsun Hsieh, Hsinchu (TW); Chien-Yuan Wang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 146 days.

(21) Appl. No.: 12/216,848

(22) Filed: Jul. 11, 2008

(65) Prior Publication Data
US 2009/0014744 A1    Jan. 15, 2009

(30) Foreign Application Priority Data

Jul. 12, 2007   (TW) .............................. 96125838 A

(51) Int. Cl.
*H01L 33/00* (2010.01)
(52) U.S. Cl. .................. 257/98; 257/E33.061
(58) Field of Classification Search ..................... 257/98, 257/E33.061; 438/29
See application file for complete search history.

(56) References Cited

U.S. PATENT DOCUMENTS

| 6,066,861 | A | 5/2000 | Hohn et al. | |
| 6,696,703 | B2 * | 2/2004 | Mueller-Mach et al. | 257/98 |
| 7,402,831 | B2 * | 7/2008 | Miller et al. | 257/13 |
| 2005/0151141 | A1 | 7/2005 | Grotsch et al. | |
| 2005/0274967 | A1 | 12/2005 | Martin et al. | |

FOREIGN PATENT DOCUMENTS

| CN | 1747190 | 3/2006 |
| WO | WO 2007063460 | 6/2007 |

OTHER PUBLICATIONS

English language translation of Chinese Patent Application Publication 174190 to Mingxun et al., Jul. 2010.*

* cited by examiner

*Primary Examiner* — Mark Prenty
(74) *Attorney, Agent, or Firm* — Bacon & Thomas, PLLC

(57) ABSTRACT

The present invention discloses a semiconductor light-emitting device including a semiconductor light-emitting element, a first attaching layer and a wavelength conversion structure. The primary light emitted from the semiconductor light-emitting element enters the wavelength conversion structure to generate a converted light, whose wavelength is different form that of the primary light. In addition, the present invention also provides the method for forming the same.

18 Claims, 13 Drawing Sheets

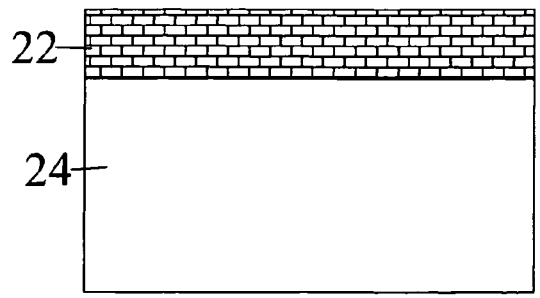
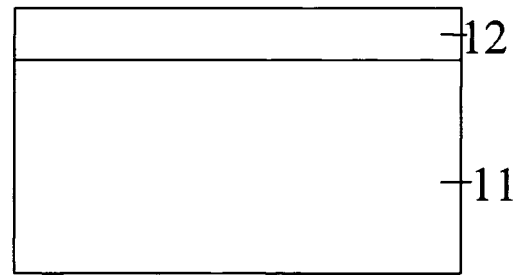
FIG. 2  FIG. 3
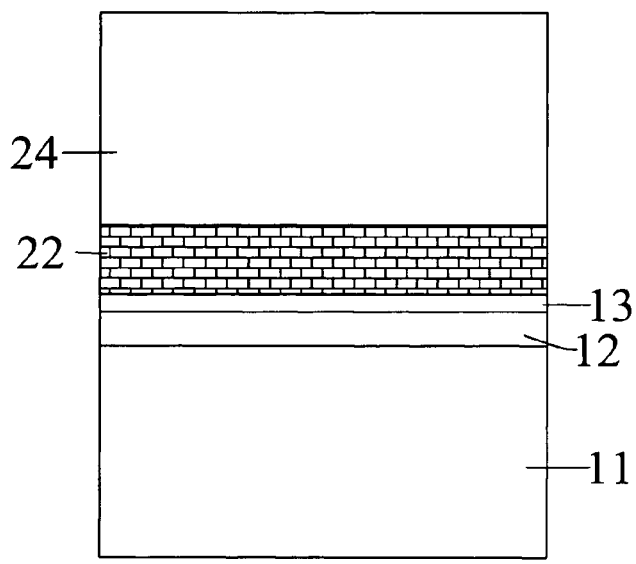
FIG. 4

70

80

90

SEMICONDUCTOR LIGHT-EMITTING DEVICE AND METHOD

RELATED APPLICATIONS

The present application claims the right of priority based on TW patent application, Ser. No. 096125838, entitled "SEMICONDUCTOR LIGHT EMITTING DEVICE AND METHOD", filed on Jul. 12, 2007, the disclosure of which is incorporated herein by reference in its entirety.

TECHNICAL FIELD

The present invention relates to a semiconductor light-emitting device, and more particularly, to a semiconductor light-emitting device having a wavelength conversion structure.

BACKGROUND

A light emitting diode (LED) is a solid-state semiconductor element including at least a p-n junction. The p-n junction is formed between a p-type and an n-type semiconductor layers. When the p-n junction receives a suitable forward voltage, the holes of the p-type semiconductor layer and the electrons of the n-type semiconductor layer are combined to emit light. Generally, the region emitting light is called a light-emitting region.

The characteristics of LEDs are small dimension, high lighting efficiency, long lifetime, quick reaction, high reliability, and great chromaticity, so LEDs have been applied widely in electronic devices, motor, signboard, and traffic signals. With its full color spectrum, LED has gradually replaced conventional lighting apparatus such as fluorescent lamps and incandescent lamps.

Generally, a LED chip is utilized with a wavelength-converted material such as phosphor to generate white light. The wavelength-converted material can emit yellow light, green light, or red light after receiving blue light from the LED chip, and then blue light and yellow light, green light, or red light can be mixed to generate white light. Because the emitting direction of light is omnidirectional to ensure that light from an LED chip can pass the wavelength-converted material and be mixed to generate the desired light, the wavelength-converted material has to totally cover the positions where light emits. If the wavelength-converted material does not totally cover where light emits out of the LED chip, a portion of light such as side-emitting light does not pass the wavelength-converted material and the wavelength converting efficiency is reduced. On the other hand, although the wavelength-converted material totally covering the LED chip can increase wavelength-converting efficiency, it causes some problems like poor heat dissipation.

It is not easy to cover the LED chip uniformly with the wavelength-converted material. And because thicker wavelength-converted material receives more light than thinner wavelength converted material does, the chromaticity of light is different when the omnidirectionally emitted light passes the wavelength-converted materials of different thickness. Although there are a lot of complicated methods such as electrophoresis which is able to coat the wavelength-converted material on the LED chip uniformly, the manufacturing cost is higher or the yield is lower. In addition, the wavelength-converted material normally has to be formed with an adhesive material like glue so it is unavoidable that much of light is absorbed by the adhesive material and the wavelength-converting efficiency is therefore damaged.

SUMMARY OF THE DISCLOSURE

The present invention provides a semiconductor light-emitting device including an opaque substrate, a semiconductor light-emitting stack which emits a primary light, a first attaching layer, and a wavelength conversion structure, wherein the semiconductor light-emitting stack is attached to the wavelength conversion structure by the first attaching layer. The wavelength conversion structure receives the primary light from the semiconductor light-emitting stack and then generates a converted light whose wavelength is different from that of the primary light. In addition, there is at least a reflective layer or a transparent conductive layer in-between the opaque substrate and the semiconductor light-emitting stack.

The present invention also provides a method manufacturing a semiconductor light-emitting device, including forming a semiconductor light-emitting stack on an opaque substrate, and attaching a wavelength conversion structure to the semiconductor light-emitting stack by a second attaching layer.

BRIEF DESCRIPTION OF THE DRAWINGS

FIG. 2 shows a cross-sectional view of a wavelength conversion structure in accordance with an embodiment of the present invention.

FIG. 3 shows a cross-sectional view of a semiconductor light-emitting element in accordance with an embodiment of the present invention.

FIG. 4 shows a cross-sectional view of a semiconductor light-emitting structure in accordance with an embodiment of the present invention.

DETAILED DESCRIPTION OF THE PREFERRED EMBODIMENTS

Figure 1:
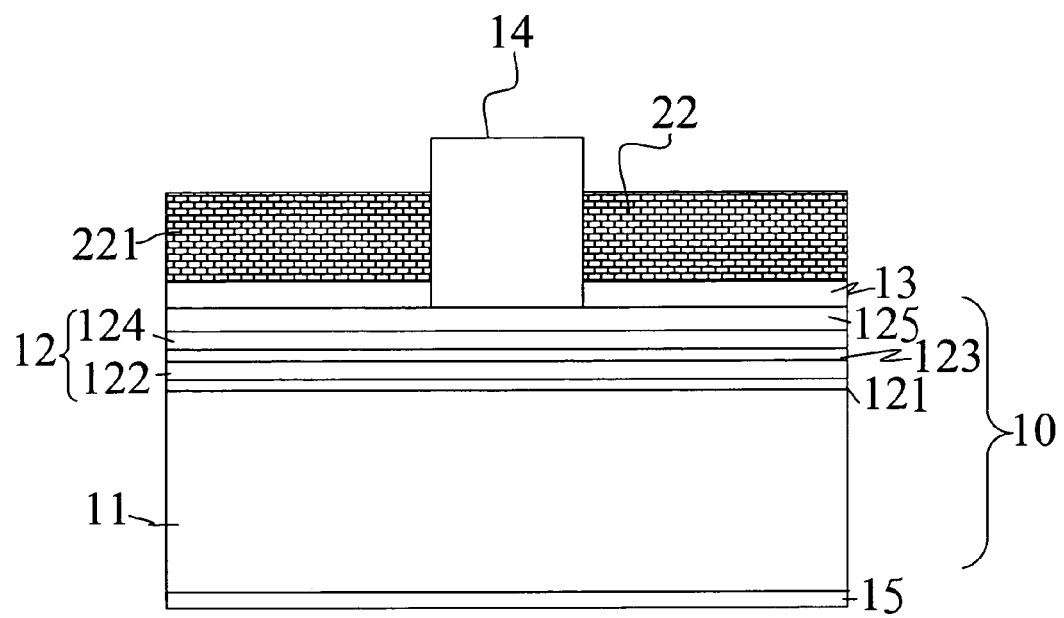
FIG. 1 shows a cross-sectional view of a semiconductor light-emitting device in accordance with an embodiment of the present invention.

Referring to FIG. 1, in the present embodiment, a semiconductor light-emitting device 1 includes a semiconductor light-emitting element 10; a first attaching layer 13; and a wavelength conversion structure 22, wherein the semiconductor light-emitting element 10 includes a semiconductor light-emitting stack 12 and an opaque substrate 11. The semiconductor light-emitting stack 12 is located on the opaque substrate 11 and includes a buffer layer 121, an n-type semiconductor layer 122, an active layer 123, a p-type semiconductor 124, and a contact layer 125. The material of the active layer 123 includes II-VI group semiconductor, III-V group semiconductor such as AlGaInP, AlGaInN, InGaN, SiC, ZnCdSe, or the combination thereof. The materials of the contact layer 125, the n-type semiconductor layer 122, and the p-type semiconductor layer 124 include II-VI group semiconductor, III-V group semiconductor, SiC, ZnCdSe, the combination thereof, or other materials matching with the active layer 123. The positions of the n-type semiconductor layer 122 and the p-type semiconductor layer 124 are unrestricted to aforementioned description and can be changed according to requirement. The material of the opaque substrate 11 can be semiconductor material, metal material, composite material, or the combination thereof. Preferably, it includes semiconductor, metal, Si, IP, ZnSe, AlN, GaAs, Metal Matrix Composite (MMC), Ceramic Matrix Composite (CMC), or the combination thereof. The opaque substrate 11 further includes a Distributed Bragg Reflector (DBR) layer located thereon and can have high heat-dissipation efficiency.

The wavelength conversion structure 22 is located on the first attaching layer 13, covers approximately the whole top surface of the semiconductor light-emitting element 10 and is composed of at least a wavelength-converted material 221. When the semiconductor light-emitting stack 12 receives a current, it can emit a primary light. The primary light enters the wavelength conversion structure 22 and then is absorbed by the wavelength-converted material 221 thereof to generate a converted light whose wavelength is different from that of the primary light. Because the wavelength-converted material 221 is unrestricted to one kind, the converted light can be of multiple colors. Before being attached to the semiconductor light-emitting stack 12, the wavelength conversion structure 22 is formed on a temporary substrate (not shown here) and then is attached to the semiconductor light-emitting stack 12 by the first attaching layer 13 so the process of encapsulating a chip can be simplified and the thickness and quality of the wavelength conversion structure 22 can be controlled easily. In addition, because the wavelength conversion structure 22 does not cover the opaque substrate 11, the opaque substrate 11 having high heat-dissipation efficiency can dissipate easily the heat from the semiconductor light-emitting stack 12,and the performance of the semiconductor light-emitting device 1 is promoted accordingly.

In the present embodiment, the wavelength conversion structure 22 can include only the wavelength-converted material 221 or be a non-glue wavelength-converted material structure. The non-glue wavelength-converted structure 22 is a conglomeration of wavelength-converted materials without glue like paste, epoxy or other glued adhesive materials. If the wavelength conversion structure 22 only includes the wavelength-converted material 221, the method for gathering the wavelength-converted material 221 can include precipitation process or other physical deposition processes. The adhesion between the semiconductor light-emitting stack 12 and the wavelength conversion structure 22 can be increased by heating or pressing the wavelength-converted material 221. If the wavelength conversion structure 22 is the non-glue wavelength conversion structure, the light can avoid being absorbed by glue so better wavelength conversion efficiency and color can be provided. In addition, adjusting the thickness of the wavelength conversion structure 22 and the distribution of the wavelength-converted material 221 can control the ratio of conversion of the primary light. The primary light being not converted and the converted light are mixed suitably to generate white light with better color rendering index.

In this embodiment, the wavelength-converted material 221 can be phosphor such as $Y_3Al_5O_{12}$. Moreover, the wavelength-converted material 221 can also include $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, (Ca,Sr)S:Eu,Mn, (Ca,Sr)S:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, or II-VI group semiconductor. Preferably, it can be a non-insulating material such as CdZnSe.

The first attaching layer 13 is located on the semiconductor light-emitting stack 12 and attaches the semiconductor light-emitting element 10 to the wavelength conversion structure 22. The first attaching layer 13 can be epoxy, polyimide (PI), polyetherimide, PFCB, or other substitution. Preferably, it can be a transparent material such as BCB. Basically, the first attaching layer 13 is a structure which is doped no wavelength-converted material 221 intentionally and is independent from other layers. However, the first attaching layer 13 also can be doped with the wavelength-converted material 221 according to requirement. The semiconductor light-emitting device 1 further includes a first electrode 14 and a second electrode 15. The first electrode 14 is located on the contact layer 125 and pierces the wavelength conversion structure 22 and the first attaching layer 13 to electrically contact to the semiconductor light-emitting stack 12. The second electrode 15 is formed under the opaque substrate 11 to form an electrical circuit.

Figure 5:
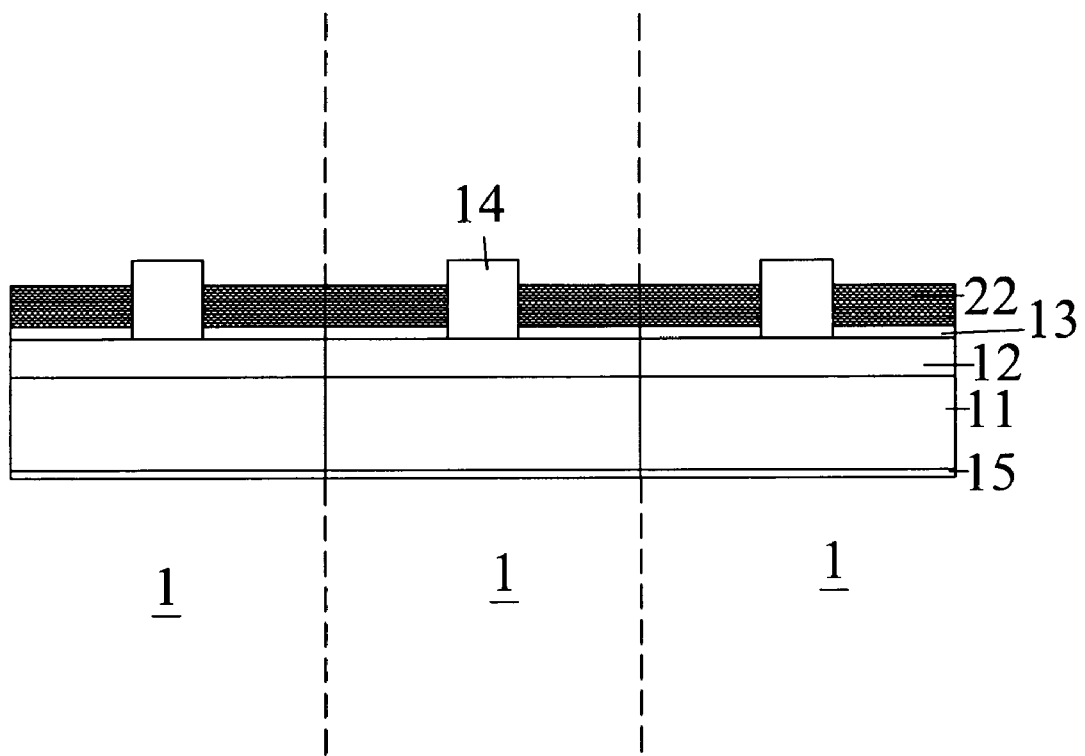
FIG. 5 shows a cross-sectional view of a wafer in accordance with an embodiment of the present invention.

As shown in FIGS. 2-4, a manufacturing method of this embodiment starting from a wafer form includes forming a wavelength conversion element 20 including a wavelength conversion structure 22 and a temporary substrate 24; forming a semiconductor light-emitting element 10 including a semiconductor light-emitting stack 12 and an opaque substrate 11; and attaching the wavelength conversion element 20 to the semiconductor light-emitting element 10 by a first attaching layer 13 to form a semiconductor light-emitting structure 30, wherein the temporary substrate 24 can be kept or removed alternatively. A process such as etching is utilized to form a first electrode and a second electrode (not shown here) then. The semiconductor light-emitting structure 30 is processed to form a chip of the semiconductor light-emitting device 1 shown in FIG. 1 by a dicing process. Referring to FIG. 5, the number of the chips is for representation only.

The wavelength conversion structure 22 is formed on the temporary substrate 24 by the method of precipitation, deposition, or growing the wavelength-converter material 221 thereon. If the wavelength-converted material 221 is composed of II-VI group semiconductor only, lift-off process to remove the temporary substrate 24 is preferable. Moreover, the wavelength-converted material 221 also can be coated on the temporary substrate 24 by printing. The aforementioned deposition includes Chemical Vapor Deposition (CVD), Metal-organic Chemical Vapor Deposition (MOCVD), Vapor Phase Epitaxy (VPE), Liquid Phase Epitaxy (LPE), or Molecular Beam Epitaxy (MBE). The temporary substrate 24 can be transparent material or opaque material. If the temporary substrate 24 is opaque, it can be removed after the wavelength conversion element 20 is attached to the semiconductor light-emitting element 10.

In another embodiment, comparing to the opaque substrate 11 and the wavelength conversion structure 22, the thickness of the semiconductor light-emitting stack 12 is considerably thin. For example, the thickness of the opaque substrate 11 is about 100 μm and that of the wavelength conversion structure 22 is about 10 μm. However, the thickness of the semiconductor light-emitting stack 12 is only about 3 μm. Thus, less light from the semiconductor light-emitting stack 12 emits laterally and the probability of the primary light passing the wavelength conversion structure 22 is increased.

Figure 6:
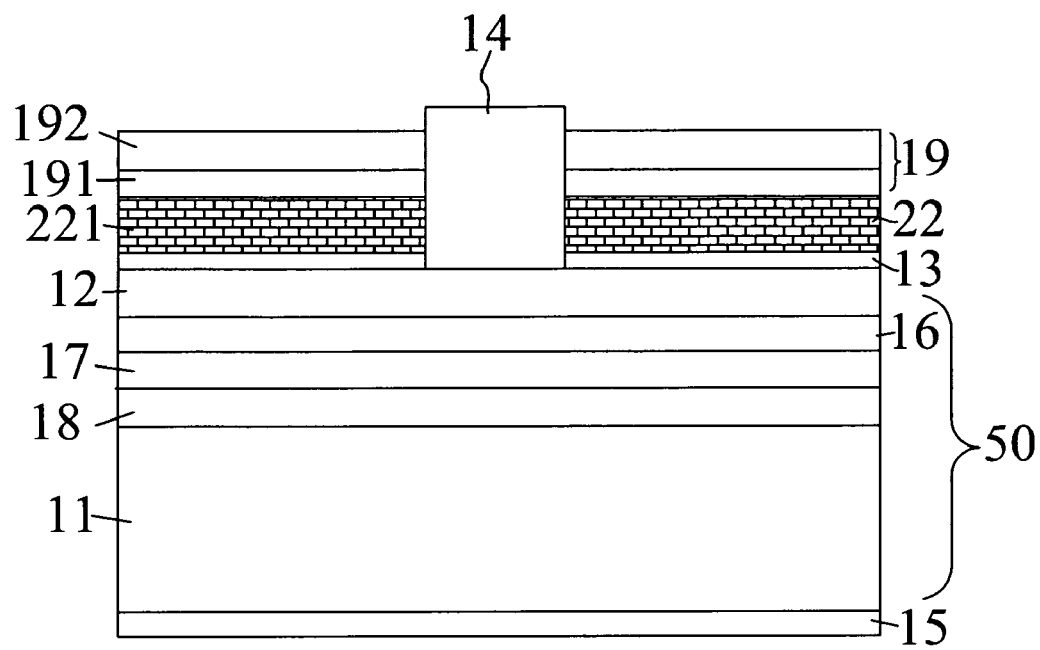
FIG. 6 shows a cross-sectional view of a semiconductor light-emitting device in accordance with another embodiment of the present invention.

Referring to FIG. 6, in another embodiment, a semiconductor light-emitting device 2 includes the first electrode 14, the second electrode 15, the opaque substrate 11, the semiconductor light-emitting stack 12, the first attaching layer 13, and the wavelength conversion structure 22. In addition, the semiconductor light-emitting device 2 further includes a transparent conductive layer 16, a reflective layer 17, a second attaching layer 18, and a protective structure 19. The transparent conductive layer 16 is located under the semiconductor light-emitting stack 12 and is formed therewith. It can spread current and form ohmic contact with other layers. The material of the transparent conductive layer 16 includes ITO, CTO, ATO, ZnO, ZTO, Ni/Au, NiO/Au, TiWN, transparent metal layers, the combination thereof, or other substitute materials. The reflective layer 17 can be located on or under the second attaching layer 18 according to the material thereof. The material of the reflective layer 17 can be metal, oxide, the combination thereof, or other reflective materials. Preferably, it includes In, Sn, Al, Au, Pt, Zn, Ag, Ti, Pb, Ge, Cu, Ni, AuBe, AuGe, AuZn, PbSn, $SiN_x$, $SiO_2$, $Al_2O_3$, $TiO_2$, MgO, or the combination thereof. In addition, it also can be a DBR.

The second attaching layer 18 is located on the opaque substrate 11 and attaches the opaque substrate 11 to the semiconductor light-emitting stack 12. The second attaching layer 18 can be metal such as AuSn, InAg, InAu, In, Au, Al, Ag, or the alloy thereof. The second attaching layer 18 is formed in-between the opaque substrate 11 and the semiconductor light-emitting stack 12 by soldering to connect thereto at a predetermined temperature. It also can be a mirror to reflect the light emitting to the opaque substrate 11 or an ohmic contact layer to form electrical connection between the opaque substrate 11 and the semiconductor light-emitting stack 12. The opaque substrate 11 is attached to the semiconductor light-emitting stack 12 under a suitable pressure such as 200 $g/cm^2$~400 $g/cm^2$ and a suitable temperature such as 200° C.~800° C., preferably 200° C.~250° C. The second attaching layer 18 also can be transparent and located on the reflective layer 17, and the material thereof can be epoxy, polyimide, polyetherimide, PFCB, or other organic bonding materials, preferably BCB. It can be a structure without the wavelength-converted material 221 independent from other layers or be doped with the wavelength-converted material 221 according to requirement.

The protective structure 19 is formed on the wavelength conversion structure 22 to protect the wavelength conversion structure 22 and other structures below from harm such as moisture or shock. The material of the protective structure 19 includes Su8, BCB, PFCB, epoxy, acrylic resin, COC, PMMA, PET, PC, polyetherimide, fluorocarbon polymer, silicone, glass, $Al_2O_3$, $SiO_2$, $SiN_x$, $TiO_2$, the combination thereof, or other transparent materials. The protective structure 19 further includes a plurality of optical layers 191 and 192. Each of them has different thickness to release the thermal stress of the protective structure 19 according to different conditions of the processes to prevent the protective layer 19 from crack. The first optical layer 191 and the second optical layer 192 can be diffusers, concentrators, or other structures that adjust the illuminant characteristic of the semiconductor light-emitting device 2.

Figures 7, 8:
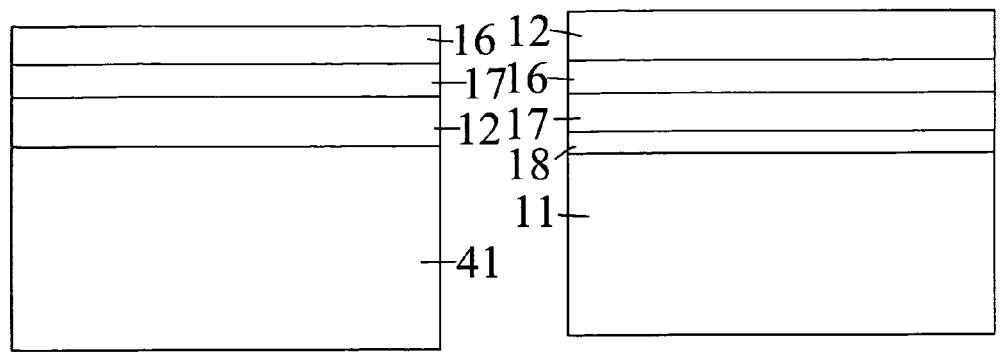
FIG. 7 shows a cross-sectional view of a semiconductor element in accordance with another embodiment of the present invention.
FIG. 8 shows a cross-sectional view of a semiconductor light-emitting device in accordance with another embodiment of the present invention.
Figure 9:
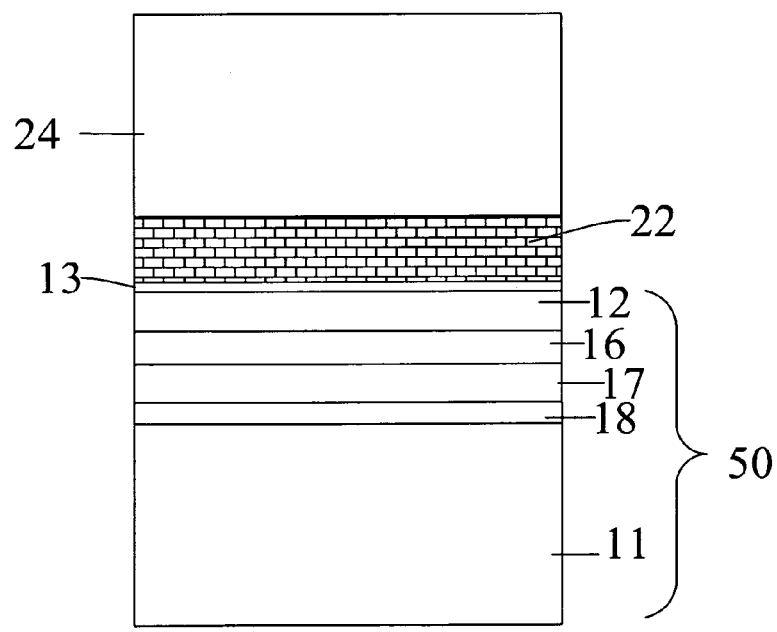
FIG. 9 shows a cross-sectional view of a semiconductor light-emitting structure in accordance with another embodiment of the present invention.
Figure 10:
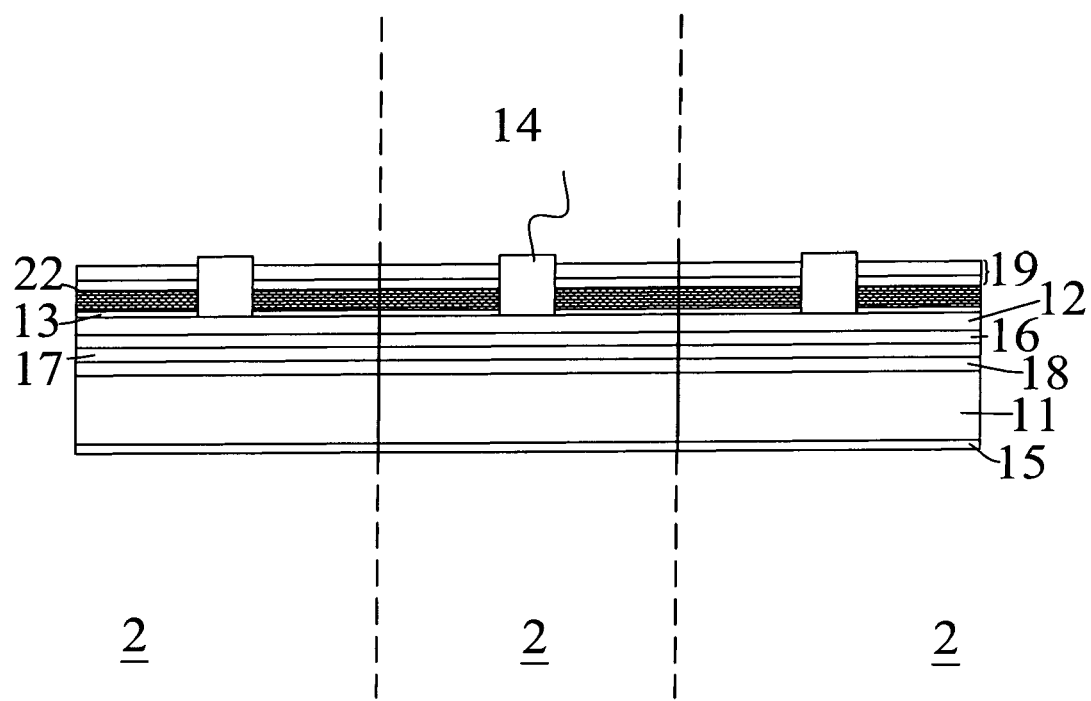
FIG. 10 shows a cross-sectional view of a wafer in accordance with another embodiment of the present invention.

Referring to FIGS. 7-9, a manufacturing method of this embodiment starting from wafer form includes forming a semiconductor light-emitting stack 12, a transparent conductive layer 16, and a reflective layer 17 on a growth substrate 41 to form a semiconductor element 40; attaching an opaque substrate 11 to the semiconductor element 40 by a second attaching layer 18; removing the growth substrate 41 to form a semiconductor light-emitting element 50; attaching the semiconductor element 50 to a wavelength conversion element 20 shown in FIG. 2 by a first attaching layer 13 to form a semiconductor light-emitting structure 60, wherein a temporary substrate 24 of the wavelength conversion element 20 can be kept or removed alternatively. If the temporary substrate 24 is transparent, it can be kept as the protective structure 19. The semiconductor light-emitting structure 60 is processed to form a chip of the semiconductor light-emitting device 2 by a dicing process. Referring to FIG. 10, the number of the chips is for representation only. If the second attaching layer 18 is formed on the transparent conductive layer 16 or the reflective layer 17, it is transparent. However, the reflective layer 17 also can be formed on the opaque substrate 11.

Figure 11:
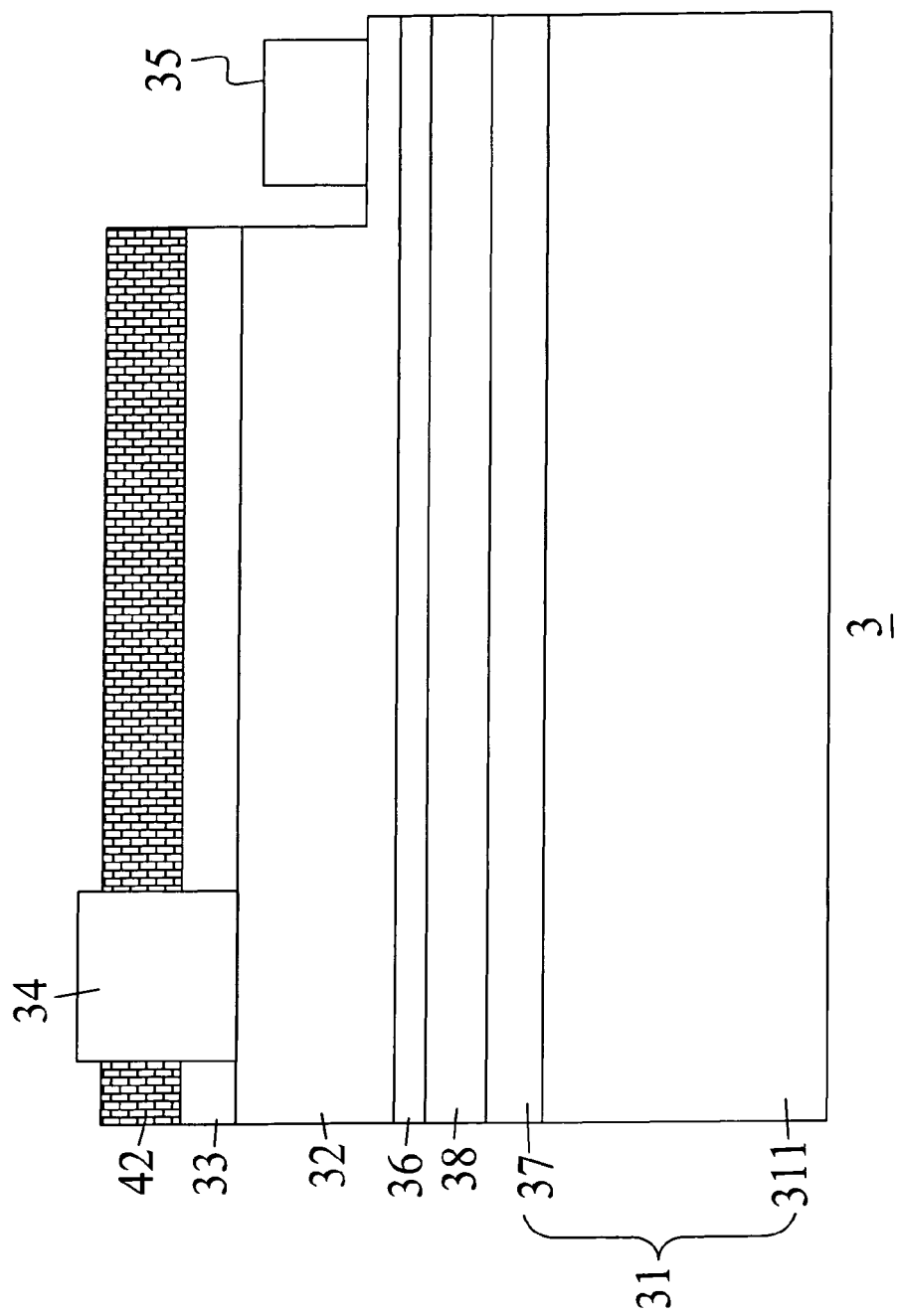
FIG. 11 shows a cross-sectional view of a semiconductor light-emitting device in accordance with another embodiment of the present invention.

Referring to FIG. 11, in another embodiment, a semiconductor light-emitting device 3 includes an opaque substrate 31, a semiconductor light-emitting stack 32, a first attaching layer 33, a first electrode 34, a second electrode 35, a transparent conductive layer 36, a reflective layer 37, a second attaching layer 38, and a wavelength conversion structure 42. The first electrode 34 and the second electrode 35 are on the same side of the opaque substrate 31. The opaque substrate 31 includes a reflective layer 37 located on a base 311. The reflective layer 37 can reflect the light emitting to the base 311 to the wavelength conversion structure 42 without passing the base 311 when the second attaching layer 38 is transparent. On the other hand, the reflective layer 37 can also be located in-between the second attaching layer 38 and the transparent conductive layer 36.

Figures 12, 13:
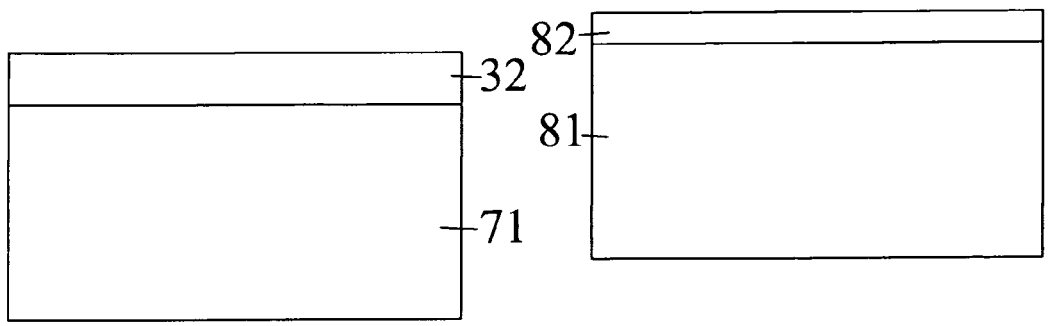
FIG. 12 shows a cross-sectional view of a semiconductor element in accordance with another embodiment of the present invention.
FIG. 13 shows a cross-sectional view of a transient substrate and a temporary attaching layer in accordance with an embodiment of the present invention.
Figure 14:
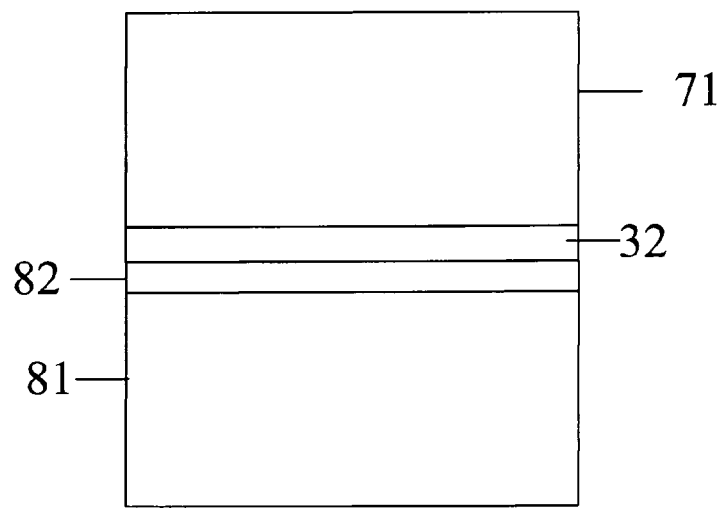
FIG. 14 shows a cross-sectional view of FIG. 12 attached to a structure shown in FIG. 13.
Figure 15:
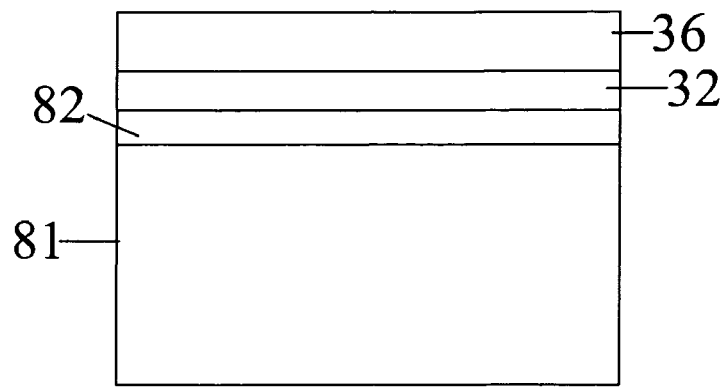
FIG. 15 shows a cross-sectional view of FIG. 14 after removing a growth substrate and forming a transparent conductive layer.
Figure 16:
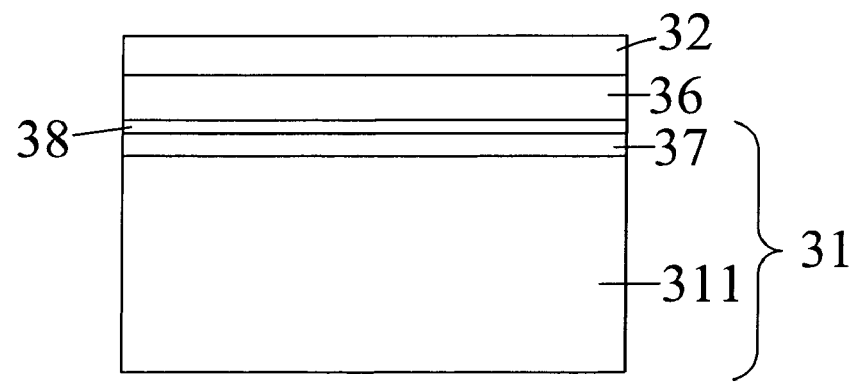
FIG. 16 shows a cross-sectional view of FIG. 15 attached to an opaque substrate.
Figure 17:
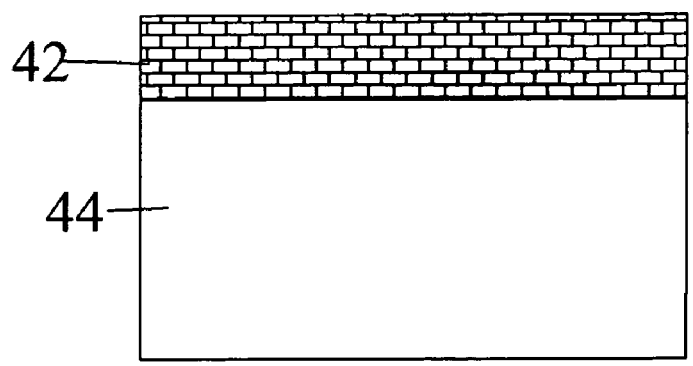
FIG. 17 shows a cross-sectional view of a wavelength conversion structure in accordance with another embodiment of the present invention.
Figure 18:
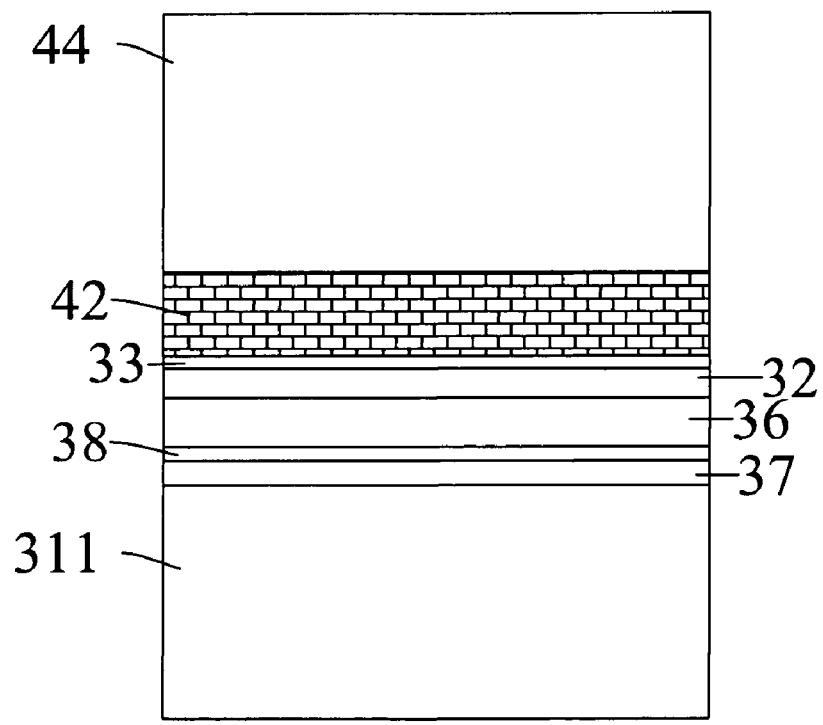
FIG. 18 shows a cross-sectional view of a semiconductor light-emitting structure in accordance with another embodiment of the present invention.
Figure 19:
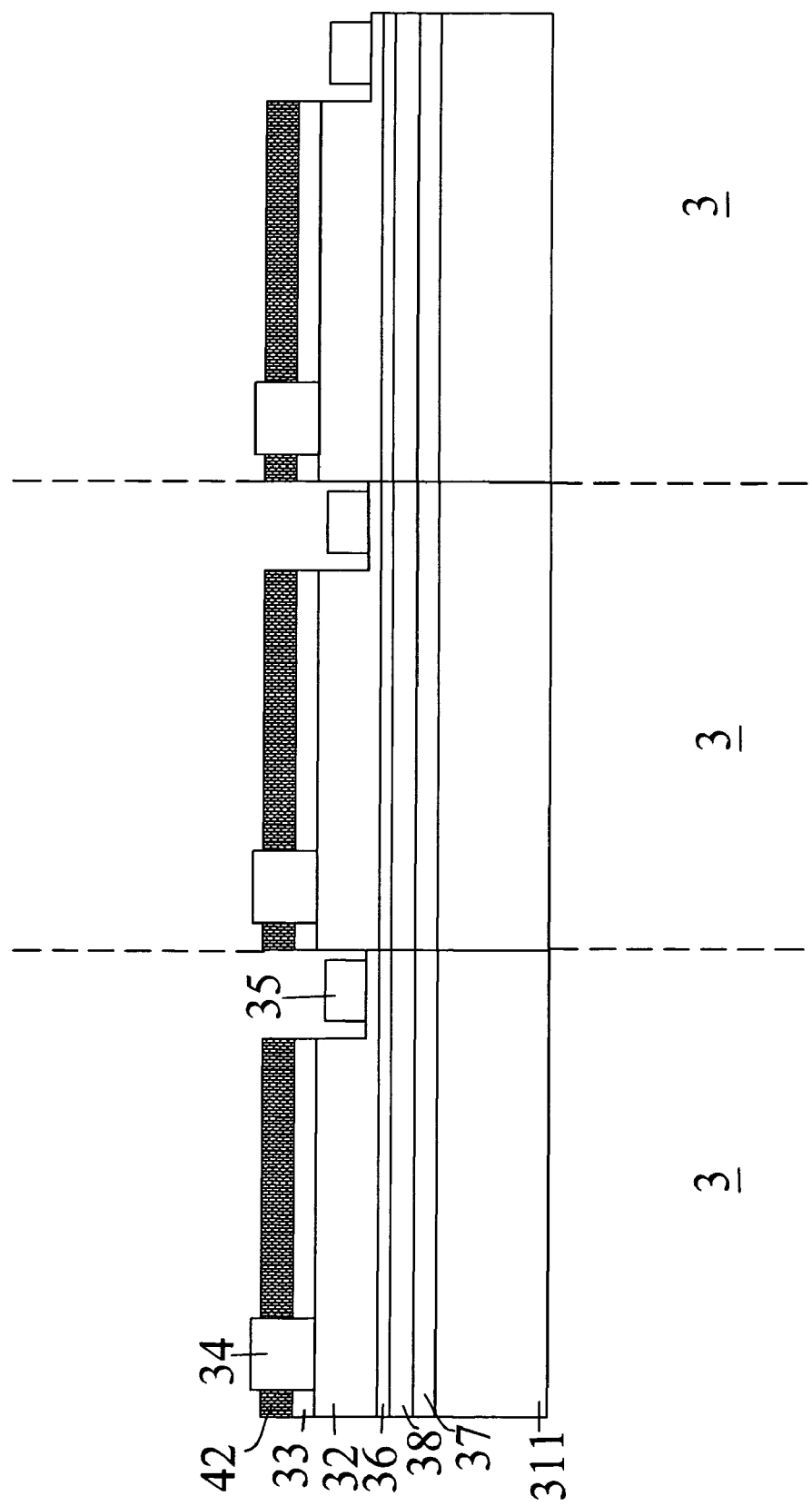
FIG. 19 shows a cross-sectional view of a wafer in accordance with further another embodiment of the present invention.

Referring to FIGS. 12-18, a manufacturing method of this embodiment starting from the wafer form includes forming a semiconductor element 70, including forming a semiconductor light-emitting stack 32 on a growth substrate 71 as shown in FIG. 12; forming a temporary attaching layer 82 on a transient substrate 81 as shown in FIG. 13; attaching the transient substrate 81 to the semiconductor element 70 by the temporary attaching layer 82 as shown in FIG. 14; removing the growth substrate 71; forming a transparent conductive layer 36 on the semiconductor light-emitting stack 32 as shown in FIG. 15; attaching the semiconductor light-emitting stack 32 and the transparent conductive layer 36 to an opaque substrate 31 including a reflective layer 37 by a second attaching layer 38; removing the transient substrate 81 and the temporary attaching layer 82 as shown in FIG. 16; forming a wavelength conversion element 80 including a wavelength conversion structure 42 located on a temporary substrate 44; and attaching the wavelength conversion element 80 to the semiconductor light-emitting stack 32 by a first attaching layer 33 to form a semiconductor light-emitting structure 90 as shown in FIG. 18. The semiconductor light-emitting structure 90 is processed to form a chip of the semiconductor light-emitting device 3 by a dicing process. Referring to FIG. 19, the number of the chips is for representation only. The temporary substrate 44 can be kept or removed alternatively. If it is a transparent substrate, it can be kept as a protective structure.

Figure 20:
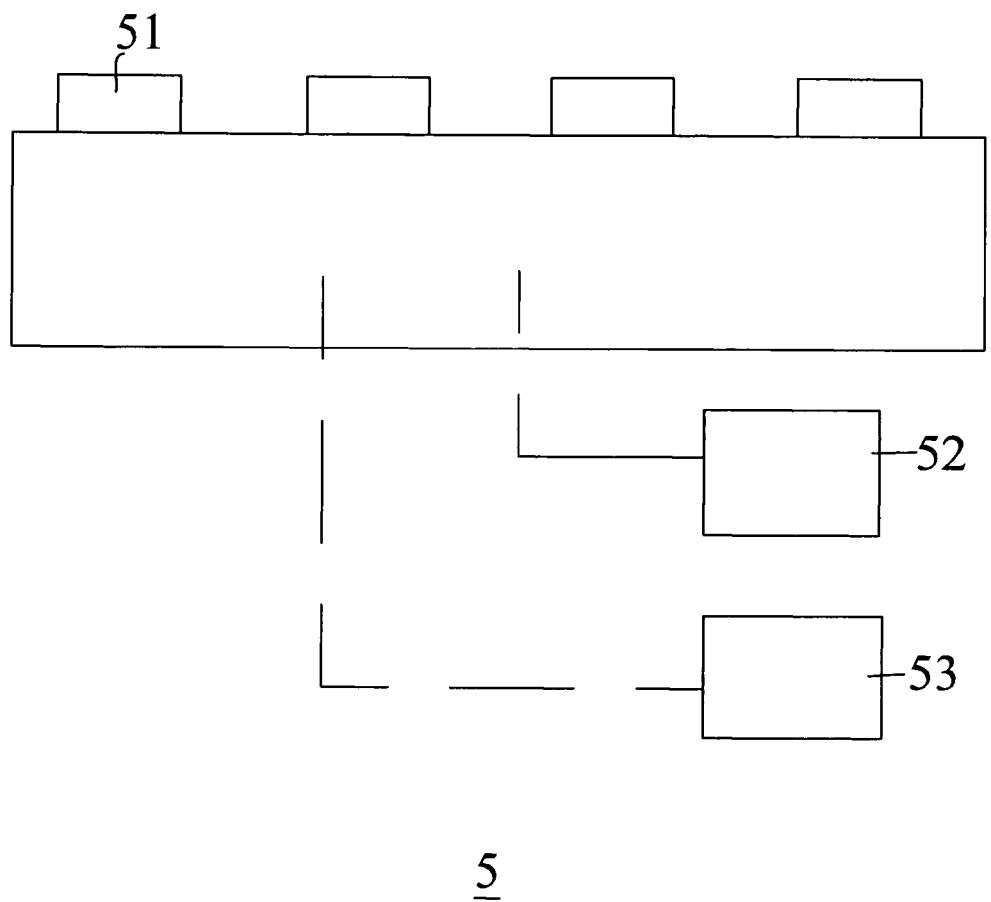
FIG. 20 shows a schematic view of a light source device including a semiconductor light-emitting device of the present invention.

FIG. 20 shows a schematic view of a light source device 5. It includes a semiconductor light-emitting device as disclosed in each of these embodiments of the present invention. The light source device 5 can be an illuminating device such as a streetlight, a vehicle light, or indoor light source, a traffic light, or a backlight source of a backlight module of a panel display. The light source device 5 includes a light source 51 composed of an aforementioned semiconductor light-emitting device, a power supply system 52 offering a current to the light source 51, and a control element 53 to control the power supply system 52.

Figure 21:
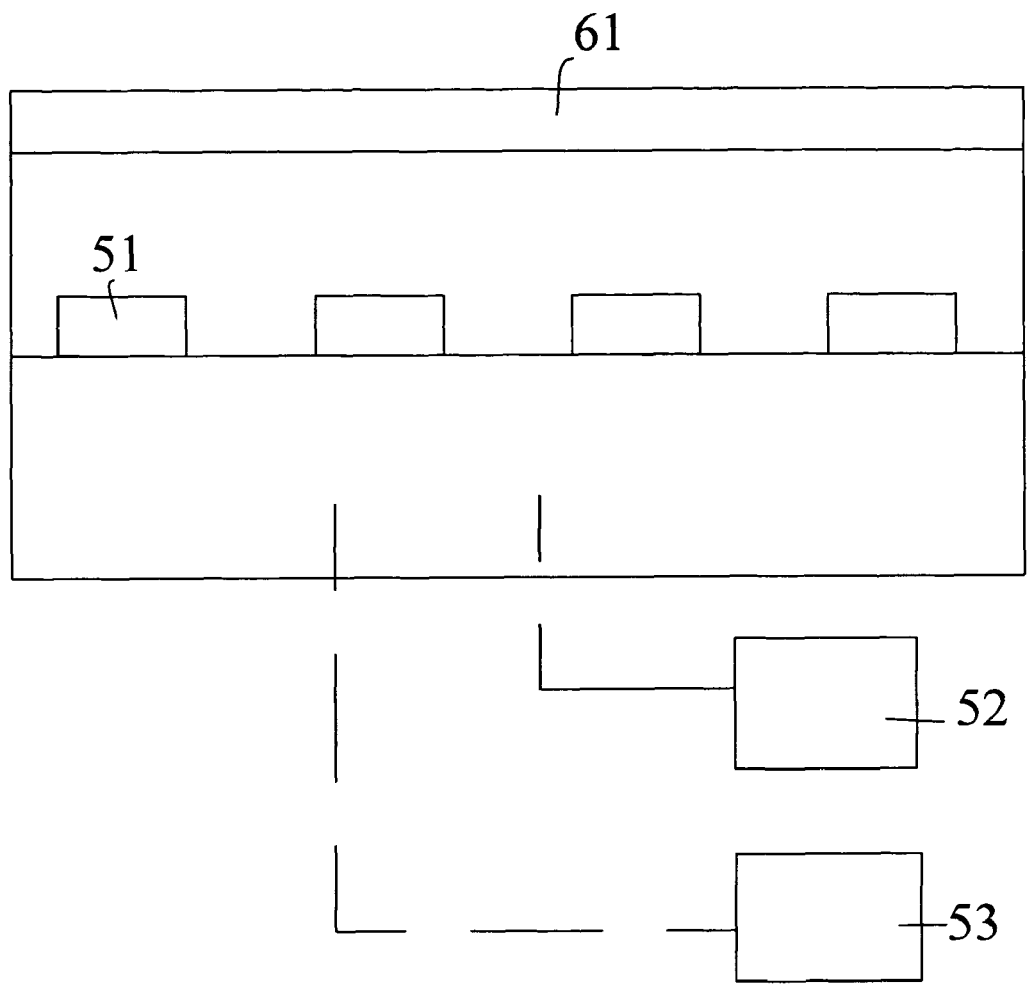
FIG. 21 shows a schematic view of a backlight unit including a semiconductor light-emitting device of the present invention.

FIG. 21 shows a schematic view of a backlight module 6. It includes the aforementioned light source device 5 and an optical element 61. The optical element 61 processes the light form the light source device 5 to apply to the panel display. For example, the optical element 61 can diffuse the light from the light source device 5.

It should be noted that the proposed various embodiments are not for the purpose to limit the scope of the invention. Any possible modifications without departing from the spirit of the invention are covered by the appended claims.

What is claimed is:

1. A semiconductor light-emitting device comprising:
a semiconductor light-emitting element comprising:
an opaque substrate; and
a semiconductor light-emitting stack located on the opaque substrate;
a first attaching layer;
a second attaching layer, located in-between the opaque substrate and the semiconductor light-emitting stack;
a transparent conductive layer, located in-between the semiconductor light-emitting stack and the second attaching layer;
a reflective layer, located under the transparent conductive layer; and
a wavelength conversion structure attached to the semiconductor light-emitting element by the first attaching layer, wherein the wavelength conversion structure comprises at least a wavelength-converted material and the first attaching layer substantially comprises no wavelength-converted material.

2. The semiconductor light-emitting device according to claim 1, wherein a material of the opaque substrate is selected from the group consisting of semiconductor, metal, composite, insulator, Si, IP, ZnSe, MN, GaAs, Metal Matrix Composite (MMC), Ceramic Matrix Composite (CMC), and combinations thereof.

3. A semiconductor light-emitting device comprising:
a semiconductor light-emitting element comprising:
an opaque substrate;
a semiconductor light-emitting stack located on the opaque substrate; and
a reflective layer between the semiconductor light-emitting stack and
the opaque substrate;
a first attaching layer; and
a wavelength conversion structure attached to the semiconductor light-emitting element by the first attaching layer, wherein the wavelength conversion structure comprises at least a wavelength-converted material.

4. The semiconductor light-emitting device according to claim 1, wherein a material of the first attaching layer is selected from the group consisting of PI, BCB, PFOB, epoxy, and other organic adhesive materials.

5. The semiconductor light-emitting device according to claim 1, wherein the wavelength conversion structure comprises no glue material.

6. The semiconductor light-emitting device according to claim 1, wherein the wavelength conversion structure comprises the wavelength-converted material only.

7. The semiconductor light-emitting device according to claim 1, wherein the wavelength-converted material is selected from the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,Ga)_2S_4$:Eu, $(Ca,Sr)S$:Eu,Mn, $(Ca,Sr)S$:Ce, $(Sr,Ba,Ca)_2Si_5N_8$:Eu, $(Ba,Sr,Ca)_2SiO_4$:Eu, $(Ca,Sr,Ba)Si_2O_2N_2$:Eu, II-VI group semiconductor, CdZnSe, and combinations thereof.

8. The semiconductor light-emitting device according to claim 1, wherein a material of the second attaching layer is selected from the group consisting of AuSn, InAg, InAu, In, Au, Al, Ag, the alloy thereof, PI, BCB, PFCB, epoxy, and other organic adhesive materials.

9. The semiconductor light-emitting device according to claim 1, further comprising a protective structure located on the wavelength conversion structure and comprising at least an optical layer.

10. A light source device, comprising:
a light source comprising at least a semiconductor light-emitting device according to claim 1;
a power supply system, offering a current to the light source; and
a control element, controlling the power supply system.

11. A backlight module, comprising:
at least a light source device according to claim 10; and
an optical element, processing light from the light source device.

12. The semiconductor light-emitting device according to claim 3, wherein a material of the opaque substrate is selected from the group consisting of semiconductor, metal, composite, insulator, Si, IP, ZnSe, AlN, GaAs, Metal Matrix Composite (MMC), Ceramic Matrix Composite (CMC), and combinations thereof.

13. The semiconductor light-emitting device according to claim 3, wherein a material of the first attaching layer is selected from the group consisting of PI, BCB, PFCB, epoxy, and other organic adhesive materials.

14. The semiconductor light-emitting device according to claim 3, wherein the wavelength-converted material is selected from the group consisting of $Y_3Al_5O_{12}$, $Gd_3Ga_5O_{12}$:Ce, $(Lu,Y)_3Al_5O_{12}$:Ce, SrS:Eu, $SrGa_2S_4$:Eu, $(Sr,Ca,Ba)(Al,$ Ga)$_2$S$_4$:Eu, (Ca,Sr)S:Eu,Mn, (Ca,Sr)S:Ce, (Sr,Ba,Ca)$_2$Si$_5$N$_8$:Eu, (Ba,Sr,Ca)$_2$SiO$_4$:Eu, (Ca,Sr,Ba)Si$_2$O$_2$N$_2$:Eu, II-VI group semiconductor, CdZnSe, and combinations thereof.

15. The semiconductor light-emitting device according to claim 3, further comprising:
    a second attaching layer, located in-between the opaque substrate and the semiconductor light-emitting stack; and
    a transparent conductive layer, located in-between the semiconductor light-emitting stack and the second attaching layer.

16. The semiconductor light-emitting device according to claim 15, wherein a material of the second attaching layer is selected from the group consisting of AuSn, InAg, InAu, In, Au, Al, Ag, the alloy thereof, PI, BCB, PFCB, epoxy, and other organic adhesive materials.

17. The semiconductor light-emitting device according to claim 1, further including a first electrode on a contact layer, wherein the first electrode pierces the wavelength conversion structure and the first attaching layer to electrically contact the semiconductor light-emitting stack and a second electrode is formed under the opaque substrate.

18. The semiconductor light-emitting device according to claim 3, further including a first electrode on a contact layer, wherein the first electrode pierces the wavelength conversion structure and the first attaching layer to electrically contact the semiconductor light-emitting stack and a second electrode is formed under the opaque substrate.

* * * * *